United States Patent
de Villeneuve

[11] Patent Number: 5,866,024
[45] Date of Patent: Feb. 2, 1999

[54] PROBE CARD IDENTIFICATION FOR COMPUTER AIDED MANUFACTURING

[75] Inventor: Thierry de Villeneuve, La Tronche, France

[73] Assignee: SGS-Thomson Microelectronics S.A., Saint Genis, France

[21] Appl. No.: 767,140

[22] Filed: Dec. 19, 1996

[30] Foreign Application Priority Data

Nov. 12, 1996 [FR] France ................................. 95 15862

[51] Int. Cl.$^6$ ...................... G06K 19/06; G06K 13/06; G06K 7/08; G01S 13/08
[52] U.S. Cl. ...................... 235/493; 235/384; 235/449; 342/51
[58] Field of Search .................... 235/382, 384, 235/449, 493; 342/51

[56] References Cited

U.S. PATENT DOCUMENTS

| | | | |
|---|---|---|---|
| 3,832,530 | 8/1974 | Reitboeck et al. | 235/61.11 |
| 4,463,353 | 7/1984 | Kuzara | 340/825.54 |
| 4,888,473 | 12/1989 | Rossi et al. | 235/376 |
| 5,030,807 | 7/1991 | Landt et al. | 235/375 |
| 5,081,446 | 1/1992 | Gill et al. | 340/572 |
| 5,240,670 | 8/1993 | Stinton | 340/825.54 |
| 5,254,939 | 10/1993 | Anderson et al. | 324/158 P |
| 5,389,769 | 2/1995 | Yamashita et al. | 235/375 |
| 5,399,983 | 3/1995 | Nagasawa | 324/578 |
| 5,410,259 | 4/1995 | Fujihara et al. | 324/758 |
| 5,450,492 | 9/1995 | Hook et al. | 380/28 |
| 5,506,498 | 4/1996 | Anderson et al. | 324/158.1 |
| 5,550,482 | 8/1996 | Sano | 324/758 |
| 5,654,693 | 8/1997 | Cocita | 340/572 |

OTHER PUBLICATIONS

French Search Report from French Patent Application No. 95 15862, filed Dec. 29, 1995.
Patent Abstracts of Japan, vol. 018, No. 092 (P–1693), Feb. 15, 1994 & JP–A–05 297064 (Tokyo Seimitsu Co. Ltd.).

*Primary Examiner*—David P. Porta
*Assistant Examiner*—Daniel St. Cyr
*Attorney, Agent, or Firm*—Wolf, Greenfield & Sacks, P.C.

[57] ABSTRACT

A system for identifying probe cards including a prober which accepts a number of interchangeable probe cards, each carrying a transponder tag; a magnetic coupling antenna supported above the probe card when it is in use, the transponder tag being substantially located within a magnetic field generated by the magnetic coupling antenna; and circuitry connected to the magnetic coupling antenna for receiving signals emitted by the transponder tag, for deriving data therefrom, and for communicating the data to a central computer which holds information on the probe cards in a memory.

22 Claims, 3 Drawing Sheets

PROBE CARD IDENTIFICATION FOR COMPUTER AIDED MANUFACTURING

BACKGROUND OF THE INVENTION

1. Field of the Invention

The invention relates to automatic identification of articles by means of attached tags, enabling non-contact automatic identification. In particular, the invention relates to identification of probe cards in a semiconductor integrated circuit manufacturing environment.

2. Discussion of the Related Art

In a factory environment, tracking the progress of product lots is often required in order to know where a particular lot is and what processing has been performed on that lot. An example is in the processing of lots of semiconductor wafers into integrated circuits.

Preferably, this tracking is computer controlled, and performed automatically. Systems exist whereby all processing machinery is connected by a communications link to a central computer, which then stores information on the process steps that have been performed on each product lot. Data on lot progress may be entered by a machine operator. Alternatively, and preferably, a system of automatically identifying lots using tags is used. For example, radio transponder tags may be encapsulated into boxes containing semiconductor wafers. Although commonly known as 'radio transponder tags', communication to and from the tags is performed using a modulated magnetic field, rather than radio transmission.

Boxes containing the transponder tags are passed in proximity to magnetic coupling antennae, which read information from the tags.

FIG. 1 shows such a system. A box 10 containing wafers 20 has arrived at a work location 25, such as an oven 30. A transponder tag 40 is integrated into the box. The tag is normally a cylindrical glass capsule, about 20 mm×4 mm×4 mm, which contains a non-volatile memory, holding an identification symbol, a small magnetic coupling antenna and control circuitry. The tag is powered by an externally applied magnetic field. The non-volatile memory is typically EEPROM. The ;control circuitry allows reading and, possibly, writing of the memory contents.

Upon arrival at the work location 25, the box 10 passes in proximity to a magnetic coupling antenna 50. The arrival of the box may be automatically detected, or signaled by operator input. A master controller 60 causes an interrogating signal to be emitted by antenna 50. In response to the interrogating signal, the transponder tag 40 emits an identification signal, containing the identification symbol. The identification signal is received by antenna 50, decoded by the master controller 60, and transmitted over a communications network 70 to a central computer 80. The master controller 60 may also emit an identification symbol of its own to the central computer, in the same transmission. The transponder tag's identification symbol typically contains a sequence of, for example, 8 bytes, indicating that the tag is in a box, and including a box identification number. The central computer 80 is programmed with a relationship between each box identification number and the lot number of the wafers 20 in the corresponding box. Thus, the central computer receives a message such as "Box 153A6 at work location 25", which it easily interprets as "Product type ST16243, Lot No. AG94, arrived at oven 30". Similar arrangements are made at other work locations 85,. 95, 105. Several antennae may be installed on one machine, all connected to a same master controller, to monitor the progress of a lot through the machine.

Optionally, at each work location, an operator input/output data terminal 106 may be installed, and connected to master controller 60. The machine operator may wear a badge 108 or a bracelet 109, carrying a transponder tag. This will be read by master controller 60, using antenna 50, to ensure that the person about to operate the machine is a qualified operator.

It is thus easy for computer 80 to control the progress of product lots through the factory.

In a semiconductor manufacturing environment, many different types of integrated circuits are produced concurrently. All are produced on identically sized wafers, contained in boxes of identical appearance. It is imperative that the correct processing is applied to each lot of wafers, corresponding to the required integrated circuit product. As the central computer knows which lot is awaiting processing on which machine, it can automatically load processing instructions customized to that particular lot onto that machine. If a lot arrives at a work location out of sequence, or has already been processed at that location, an alarm may be activated.

Such lot monitoring systems for semiconductor fabrication applications are marketed, by Fluoroware Inc., under the name 'Fluorotrac', which includes an identification system from Texas Instruments sold under the name 'TIRIS'. Typically, in such applications, the communications are performed in a frequency band just below 150 kHz, although other frequencies could be used.

Identifiers other than transponder tags may be used, but have drawbacks. Bar-code and optical character recognition (OCR) systems allow cheap tags to be used, but require careful orientation of the tag on an object, and of the object itself, to allow reading. Readers of bar-codes, and OCR readers are bulky. Such bar-code and OCR tags may become illegible after long service life.

Infra-red emitters require a battery to be included in the tag, which needs to be replaced at regular intervals.

Small, electrically powered modules may be used, but these require direct electrical connection to be made to read the identification symbol. The orientation of the object during read operations becomes critical. Corrosion of exposed electrical contacts is also likely in an industrial environment.

The transponder tag is relatively omnidirectional, and so is indifferent to object orientation. The transponder tags are sealed, and usually embedded in the objects which they identify, require no maintenance, and should not degrade with time or exposure to harsh environments. They do not require a battery.

FIG. 2 shows a probing work location. This may correspond to work location 105 of FIG. 1. Here, completed or partially completed wafers are electrically tested.

A prober, controlled by a host computer (not shown) comprises test instruments (also not shown), connected to a test head 110 and a platen 120 which defines the range of movement of a chuck 130, provided with wheels 132 or propelled by a linear motor. The chuck carries a wafer under test 140. Above the platen 120, a support 150 includes a hole 152. At the lower extremity of hole 152, a support ring 160 protrudes into the hole 152. A probe card 170 is supported by the support ring 160. The probe card itself may have a circular hole 172 in its center, with probe pins 180 protruding down through hole 172. Alternatively, the probe card 170 may have no hole, and have probe pins 180 suitably attached to the underside of the probe card. The chuck 130 moves the wafer under test 140 horizontally and vertically, to bring selected contact pads on the wafer into electrical contact with probe pins 180.

An annular sprung contact ring 190 is placed above the probe card 170, and is held *in place by an annular clamping ring 200. The test head 110 is above, and brought into proximity with the sprung contact ring 190. Sprung contact pins 205 are embedded in the sprung contact ring 190. These sprung contact pins 205 protrude from each planar surface of the sprung contact ring 190. Pairs of sprung contact pins 205, placed directly opposite each other, one on each planar surface of the sprung contact ring 190, are electrically connected together. These pairs of sprung contact pins 205 serve to electrically connect together pads on the probe card 170 and corresponding pads on the test head 110, to allow test signals to be passed to the wafer under test 140, under control of the host computer.

When a probe card with a hole is in use, the hole in the sprung contact ring 190 allows a visual check of the alignment of probepins 180 to contact pads on the wafer under test 140 to be made, using a microscope 207 installed through the test head 110. Use of probe cards with no hole requires arrangements to be made to view the probes from below the probe card.

As described above, a lot of wafers 20 arriving at the probe work location 105 is identified by tag 40 in the box 10, by master controller 60, using antenna 50.

During probing operations, the probe pins 180 are brought repeatedly into contact with the wafer under test. This causes wear to the probe pins, which are very fine. Each probe card must therefore be serviced after a certain number of wafers have been tested.

As different integrated circuits are of different sizes, the number of test operations per wafer will depend on what integrated circuit is present on the wafer. Each different integrated circuit requires a specific test program, to test the specific functions of that circuit. The pattern of contact pads may be specific to the circuit under test.

Thus, before attempting to test a wafer, one must be sure that:

1. the correct probe card 170 is installed on the prober;
2. the correct test program is about to be run; and
3. the probe card 170 is not yet due for servicing.

At least the first and third of.these requirements are usually checked by an operator, who enters data into the host computer indicating the type of integrated circuit to be tested, and a probe card identification, as written on the probe card 170. This system is imperfect, as it is often difficult to read the card identification when the card is already installed on the machine. Operators may erroneously enter a particular card identification, even though a different card may actually be installed.

Outfitting existing probers with the alternative identification apparatus to transponder tags described above has drawbacks:

the infra red emitters and the required receivers are relatively bulky, and so will not fit into the available space; they require batteries to be included, which need to be regularly replaced (although it could be possible to provide a power supply via certain sprung contact pins 205);

electrically powered modules require relatively complex reading arrangements, may require modifications to be made to the prober and/or the test head, and may be too large to fit in the available space;

bar code and optical character recognition systems, although providing inexpensive tags, require large readers which will not fit into the available space.

Although transponder tags 40 are very small, the magnetic coupling antennae 50 required are relatively large. An antenna cannot be placed at a distance from the probe card, as the card is encased by test head 110 and support 150, which. are typically metal, and which would block a modulated magnetic field. There is also not enough space under support 150 to install an antenna, as this would risk collision with the moving chuck 130.

It is therefore desired to devise an automatic probe card identification system. This would operate in conjunction with the above described, known, system for identifying boxes.

SUMMARY OF THE INVENTION

An object of the present invention is to provide a system for identifying probe cards, using transponder tags attached to the probe cards, and which requires no substantial modification to existing probers.

Another object of the present invention is to provide a magnetic coupling antenna usable in conjunction with existing probers and transponder tags to enable the automatic identification of probe cards, in a manner compatible with known transponder tag based lot identification systems.

Another object of the current invention is to provide such a system which is relatively inexpensive to implement.

Another object of the present invention is to provide an automatically identifiable probe card, compatible with such systems.

Another object of the present invention is to provide such a system which is compatible with existing transponder tag based systems.

Accordingly, the invention provides a system for identifying probe cards, including a prober which accepts a number of interchangeable probe cards, including: a probe card carrying a transponder tag; a magnetic coupling antenna supported above the probe card when it is in use, the transponder tag being substantially located within a magnetic field generated by the magnetic coupling antenna; and circuitry connected to the magnetic coupling antenna for receiving signals emitted by the transponder tag, for deriving data therefrom, and for communicating-the data to a central computer which holds information on the probe cards in a memory.

According to an embodiment of the invention the magnetic coupling antenna comprises a coil of wire wound onto an armature, shaped as a partial toroid, having two ends and a gap between the two ends.

According to an embodiment of the invention, the prober also includes a sprung contact ring held vertically above the probe card, the antenna being retained within a magnetically inert carrier, supported in a hole in the sprung contact ring.

According to an embodiment of the invention, the antenna comprises an armature in the form of a partial toroid, having a coil of wire wound thereon.

BRIEF DESCRIPTION OF THE DRAWINGS

Particular embodiments of the present invention are explained below, by way of example only, with reference to the accompanying drawings, wherein.

DETAILED DESCRIPTION

Figure 2:
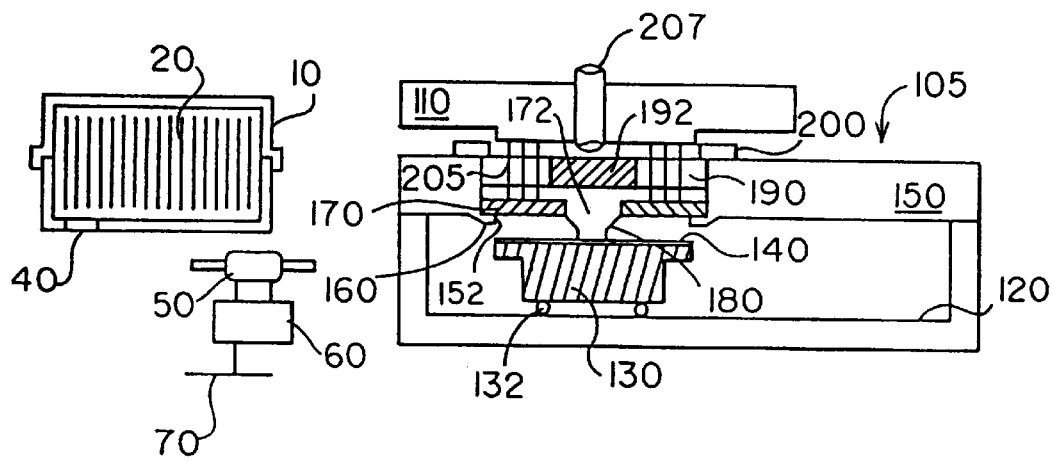
FIG. 2 shows a prober of the prior art used in conjunction with the system of FIG. 1.

As can be appreciated from FIG. 2, the space available for installing apparatus in proximity to probe card 170 is very limited.

Referring to FIG. 2, sprung contact ring 190 is annular. It contains a cylindrical hole 192, shaded in the diagram. This hole is typically 50 to 80 mm in diameter, and the sprung contact ring 190 is typically about 20 to 30 mm thick. The total distance between the test head 110 and the probe card is typically about 30 to 50 mm.

Figure 3A:
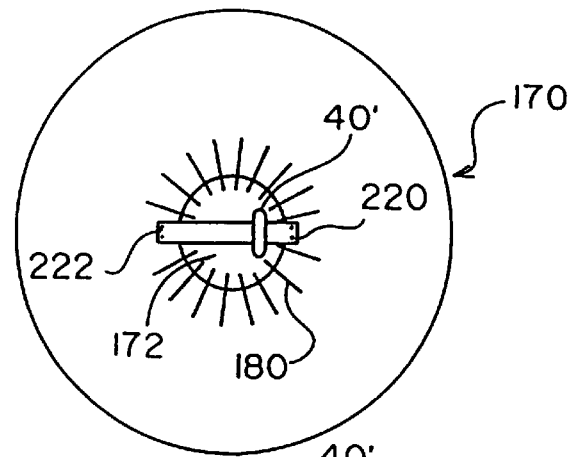
FIGS. 3A and 3B show a probe card, modified according to one aspect of the invention, in plan and elevation. respectively.
Figure 3B:
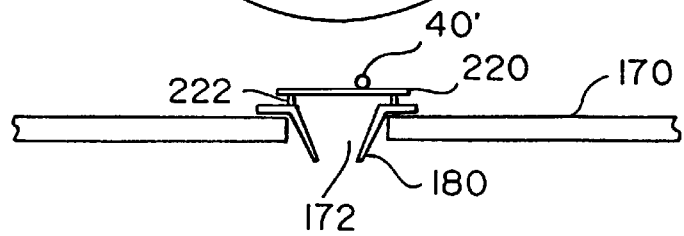

FIGS. 3A and 3B show, in plan and elevation, respectively, a probe card 170, modified according to an aspect of the invention to carry a transponder. tag 40'. The probe card has a circular hole 172 at its center, which is concentric with the hole in the sprung contact ring 190, when the card is in use. The probe pins 180 are soldered to the upper surface of the probe card, around hole 172. To allow efficient communication, the transponder tag 40' is placed away from metallic objects, such as the probe pins. This is achieved by mounting a small carrier 220 across hole 172 in probe card 170, and attaching the tag 40' thereto. The carrier 220 is typically a small piece of thin board, such as epoxy or bakelite, held by pins 222 attached at one end to probe card 170, and at the other end to carrier 220. The pattern of these pins may be specific to each probe card, to prevent transponder tags from being moved from one probe card to another during servicing. The use of carrier 220 allows the transponder tag to protrude into the hole in sprung contact ring 190, when the probe card 170 is installed in the prober.

For probe cards having no hole, the transponder tag may be mounted on the top side of the probe card, either directly, or on a carrier.

Figure 4A:
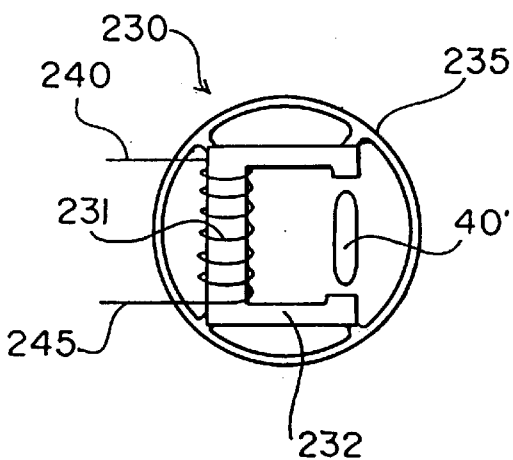
FIG. 4A shows an antenna, according to an aspect of the invention.

FIG. 4A shows a magnetic coupling antenna 230 according to an aspect of the invention. It comprises a coil 231 of wire, wound onto a ferrite or metallic armature 232 shaped as a partial toroid. This is contained within a suitable support 235, such as a cylindrical tube of plastic, or other magnetically inert material. The two extremities of the coil 231, 240, 245 are kept free. The antenna 230 is designed to operate efficiently as a transmitter and receiver of a modulated magnetic field at the frequency required by transponder tag 40'. The shape of the armature 232 is designed to channel a magnetic field generated by coil 231 to produce an optimum coupling and energy transfer from the coil 231 to the transponder tag 40'. The exact nature of the material of the armature will be selected according to the frequency operating range. The external diameter, of the support 235 is less than the diameter of the cylindrical hole in the sprung contact ring 190.

Figure 4B:
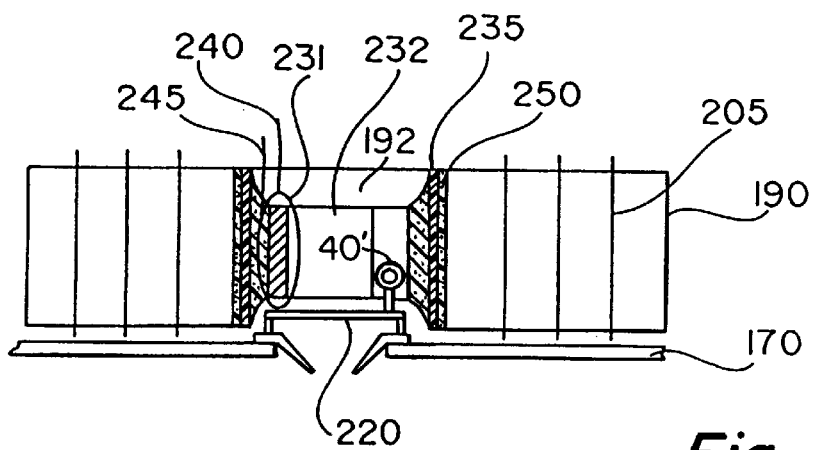
FIG. 4B shows a cross section of a sprung contact ring, modified according to an aspect of the invention, to include the antenna of FIG. 4A.

FIG. 4B shows a cross-section of a sprung contact ring modified according to the invention. The support 235 of FIG. 4A is enclosed within the cylindrical hole 192 of the sprung contact ring 190. The height of the support 235 may extend beyond the thickness of sprung contact ring 190. The support 235 preferably extends beyond the coil 231 and armature 232 to facilitate handling and storage. A filling 250 of epoxy resin or other suitable adhesive may be used to retain the support 235 within the sprung contact ring 190. Arrangements may be made to connect the extremities of the wire 240, 245 to two of the sprung contact pins 205.

Figure 5A:
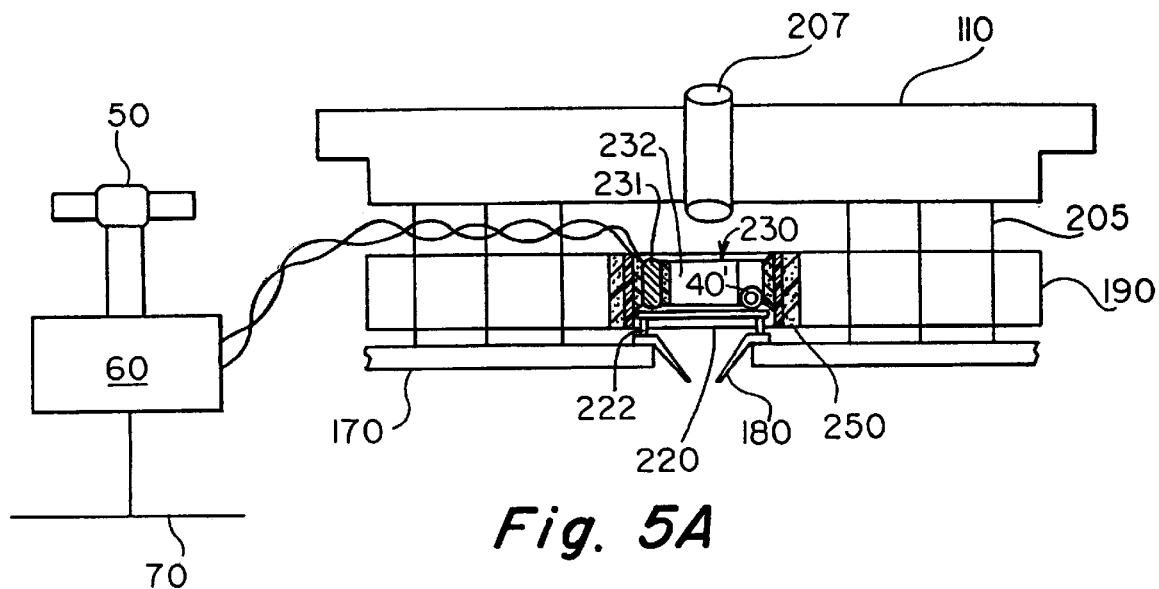
FIGS. 5A and 5B show the prober of FIG. 2, modified according to the invention.
Figure 5B:
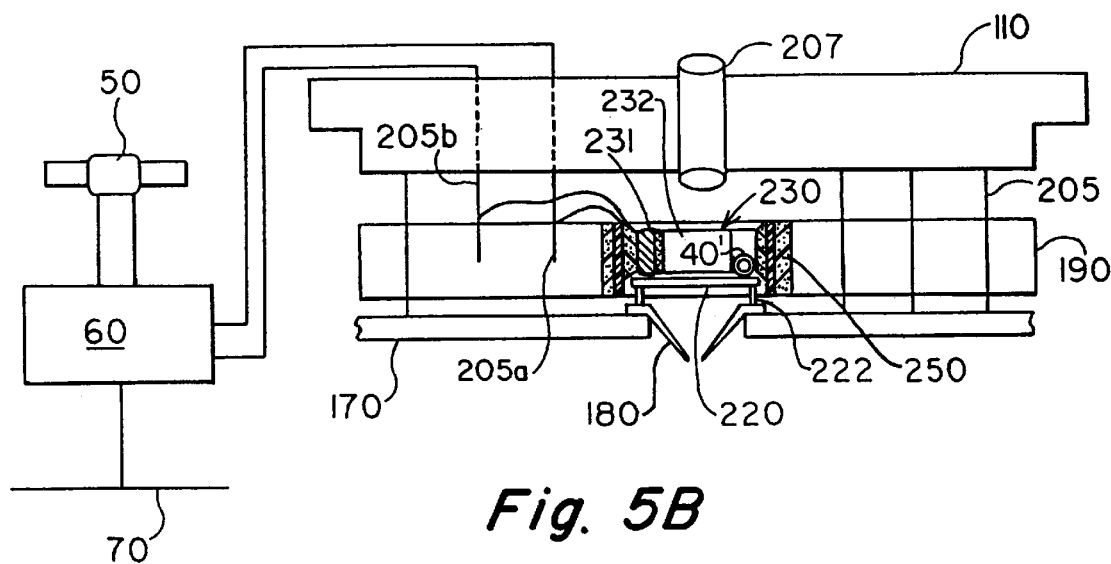

FIGS. 5A and 5B show the probe Work location 105 of FIG. 2, with the prober modified according to the present invention. Probe card 170 carrying transponder tag 40' is installed below sprung contact ring 190, itself carrying a magnetic coupling antenna 230. The radio transponder tag 40' lies within or below the gap in the armature 232. The extremities of wire 240, 245 may be brought out directly to communicate with a master controller in the same way as a standard antenna 50, as shown in FIG. 5A, or (preferably), two sprung. contact pins 205a, 205b are dedicated to connecting the antenna coil 231 to the test head 110, and further connections are made from the test head 110 to the master controller 60, as shown in FIG. 5B. The small carrier 220 raises the transponder tag 40' into the magnetic field of the armature 232, itself mounted on sprung contact ring 190, to ensure a good magnetic coupling between the coil 231 and the tag 40'.

Figure 6:
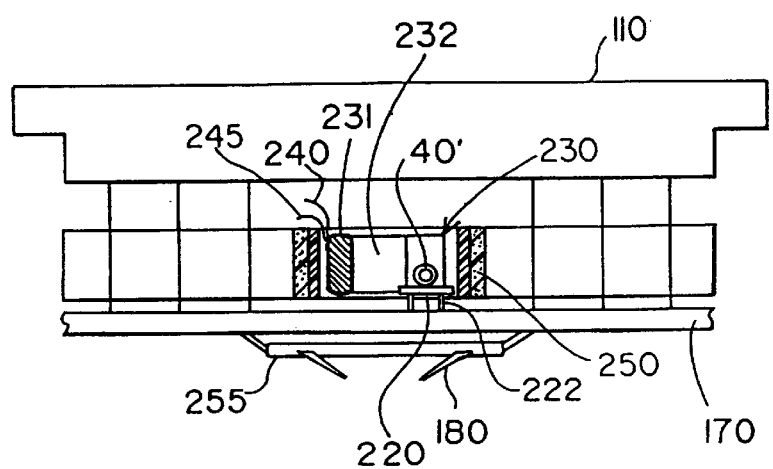
FIG. 6 shows an alternative embodiment of the invention, as applied to the prober of FIG. 2.

FIG. 6 shows an alternative arrangement using a, probe card with no hole. Probe pins 180 may themselves be attached to a small carrier 255, attached to the underside of the probe card 170. As in FIGS. 3A and 3B, the transponder tag 40' is attached to a carrier 220 on pins 222. The transponder tag 40' is then held within the magnetic field of the armature 232.

No modifications need to be made to the prober or the probe card 170, other than attaching the support 222 and the tag 40' as described. This may be simply done using epoxy resin or other suitable adhesive.

Figure 1:
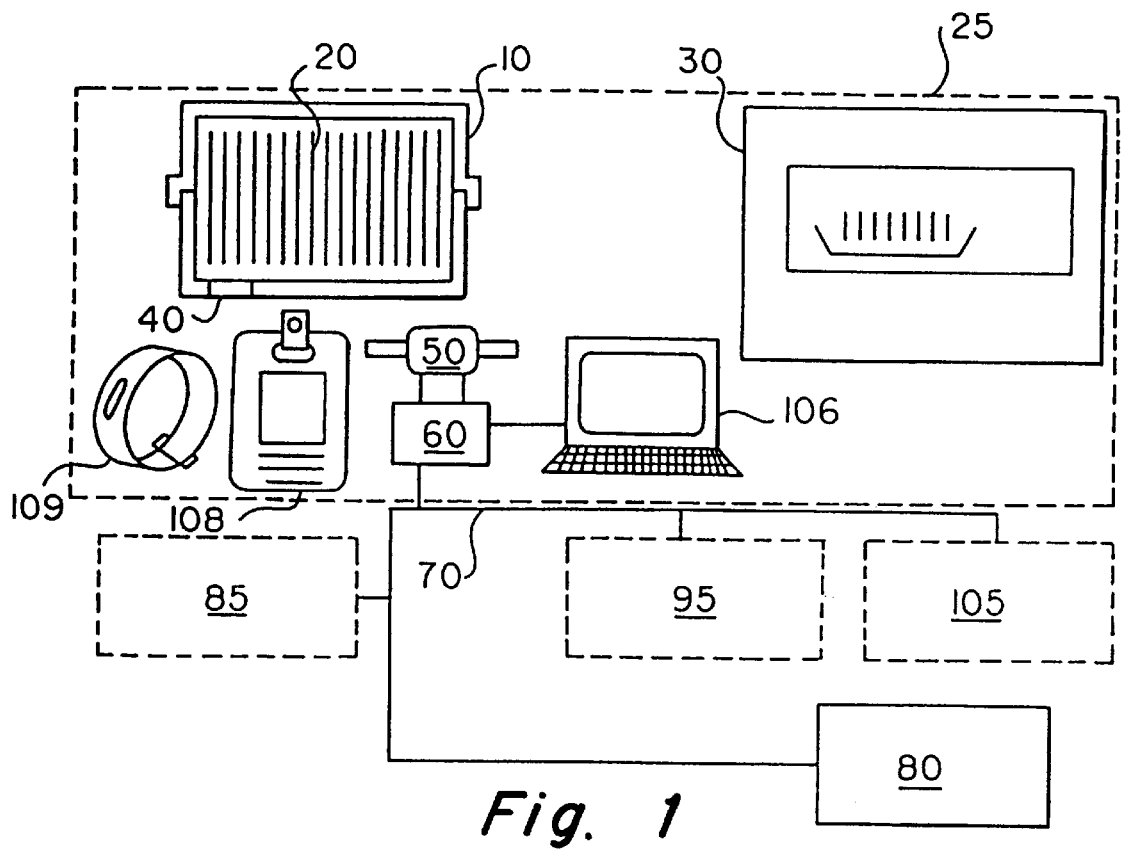
FIG. 1 shows an automatic lot control system of the prior art.

Using the probe card and the sprung contact ring described above, the system of FIG. 1 may be extended to control the supply and servicing of probe cards. The transponder tag 40' on the probe card 170 may be programmed to contain an identifier that it is a probe card, and a unique identification code. Alternatively, it may just contain a number, and the fact that it is a probe card will be known to the master controller 60 by the fact that its identification symbol is read by antenna 230. As with box identifiers, the central computer 80 is programmed with the correspondence between the identification code in the tag and the actual probe card name. Alternatively, the actual probe card name may be directly programmed into the tag.

When a lot of wafers 20 arrives at the probe work location 105, the arrival of the box 10 is signaled automatically or manually to master controller 60. The master controller then sends interrogation signals to antennae 50 and 230 (and maybe others). As before, it will receive back from the tag in the box 10 "Box 153A6", an identifier for the machine operator if a provision for operator identification is made (Such as "Operator 2725"), and an identifier from probe card 170, as received by antenna 230, such as "Probe Card A167"

These identifiers, are transmitted to the central computer 80 by master controller 60, which adds its own identifier "Work location 105". The central computer easily interprets this as "John Smith is about to load lot No. AG94 of product ST16243 onto probe station 105, using probe card ST16—3".

Thus, the central computer can ensure that the correct test program is loaded into the prober's host computer, that the correct probe card is installed, and it can count the number of times the card has been used since it was last serviced. If the card is due for a service soon, this may be communicated to the machine operator by means of a data terminal, a lamp or audible alarm. If the card's service becomes overdue, the central computer can forbid the prober to work with that probe card.

The factory's maintenance department will have access to a data entry terminal where they can update the servicing records, and allow the probe card to be used again, after being serviced. Similarly, if a probe card becomes damaged in use, this data can be entered to the central computer, and the card be forbidden for use until it has been serviced.

Thus, the present invention achieves the objectives, of:

providing a system for identifying probe cards, using transponder tags attached to the probe cards, which requires no substantial modification to existing probers;

providing such a system which is relatively inexpensive to implement;

providing an automatically identifiable probe card, compatible with such a system;

providing a magnetic coupling antenna usable in conjunction with existing probers; and providing such a system which is compatible with an existing transponder tag based lot control system.

Other types of probers are in use, which use probe cards with edge connectors. In such cases, no sprung contact ring is present. However, the advantages of the invention may also be achieved in such cases by ensuring that the gap in the armature of the antenna is located above a transponder tag installed on the probe card. Again, the use of a hollow cylindrical support has the advantage of fitting easily into the prober. Use of a partially toroidal armature allows uninterrupted visual alignment checking, using a microscope. Other types of coil support may be used, or the coil and its armature may be directly attached to the prober.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A system for identifying probe cards, including a prober which accepts a number of interchangeable probe cards, comprising:

a probe card carrying a transponder tag;

a magnetic coupling antenna supported above the probe card when the magnetic coupling antenna is in use, wherein the magnetic coupling antenna comprises a coil of wire wound onto an armature, shaped as a partial toroid, having two ends and a gap between the two ends, the transponder tag being substantially located within a magnetic field generated by the magnetic coupling antenna; and circuitry connected to the magnetic coupling antenna for receiving signals emitted by the transponder tag, for deriving data therefrom, and for communicating the data to a central computer which holds information on the probe cards in a memory.

2. A system for identifying probe cards, including a prober which accepts a number of interchangeable probe cards, comprising:

a probe card carrying a transponder tag;

a magnetic coupling antenna supported above the probe card when the magnetic coupling antenna is in use, the transponder tag being substantially located within a magnetic field generated by the magnetic coupling antenna; and a sprung contact ring, held vertically above the probe card, the magnetic coupling antenna being retained within a magnetically inert carrier, supported in a hole in the sprung contact ring; and circuitry connected to the magnetic coupling antenna for receiving signals emitted by the transponder tag, for deriving data therefrom, and for communicating the data to a central computer which holds information on the probe cards in a memory.

3. A system according to claim 2, wherein the magnetic coupling antenna comprises an armature in the form of a partial toroid, having a coil of wire wound thereon.

4. An identification system comprising:

a magnetic coupling antenna mounted within a prober, wherein said magnetic coupling antenna comprises a coil of wire wound onto an armature shaped as a partial toroid having two ends and a gap between the two ends, and a probe card including a transponder tag, wherein when said probe card is mounted within said prober, said transponder is substantially located between said two ends of said magnetic coupling antenna, and said magnetic coupling antenna receives identification information from said transponder tag.

5. An identification system comprising:

a magnetic coupling antenna mounted within a prober;

a probe card including a transponder tag, wherein when said probe card is mounted within said prober, said magnetic coupling antenna receives identification information from said transponder tag and wherein said prober accepts a plurality of interchangeable probe cards, each transponder tag of said plurality of probe cards having different identification information; and a computer means for processing said identification information.

6. The system of claim 5 wherein said computer means stores said identification information of each of said plurality of interchangeable probe cards in a memory to track probe card usage.

7. An identification system comprising:

a magnetic coupling antenna mounted within a prober wherein said magnetic coupling antenna is housed within a non-magnetic carrier mounted within a sprung contact ring of said prober; and a probe card including a transponder tag, wherein when said probe card is mounted within said prober and said magnetic coupling antenna receives identification information from said transponder tag.

8. A method for identifying each of a plurality of interchangeable probe cards used in a prober, the method comprising:

programming each of a plurality of transponder tags with identification information;

affixing one of said plurality of transponder tags to each of said probe cards;

mounting one of said probe cards within said prober; and magnetically reading said identification information from said probe card.

9. The method of claim 8 further comprising storing said identification information to track the usage history of said probe card.

10. The method of claim 9 further comprising replacing said probe card when said stored identification information indicates that service is necessary.

11. A system for identifying each of a plurality of interchangeable probe cards used in a prober, the system comprising:

means, affixed to each of said probe cards, for transmitting identification information in a magnetic form;

means for receiving said identification information;

means for processing said identification information; and means for transferring said identification information from said means for receiving to said means for processing.

12. The system of claim 11 wherein said means for transmitting comprises a transponder tag which is programmed with said identification information.

13. The system of claim 11 wherein said means for receiving comprises a magnetic coupling antenna.

14. The system of claim 13 wherein said magnetic coupling antenna comprises an armature in the form of a partial toroid, having a coil of wire wound thereon.

15. The system of claim 11 wherein said means for processing comprises computer means which receives said identification information from said means for receiving and stores said information in storage means.

16. A method of increasing the reliability of a prober which uses a plurality of interchangeable probe cards, the method comprising:

programming each of said probe cards with magnetic identification information;

reading said magnetic identification information from a probe card currently in use.

17. The method of claim 16, further comprising the steps of:

storing said magnetic identification information;

analyzing said identification information; and servicing said probe card.

18. The method of claim 17, wherein said analyzing step comprises calculating a usage history based on the use of the probe card, and said servicing step occurs when said usage history indicates that service is necessary.

19. The method of claim 16, further comprising the step of:

determining if the probe card currently in use is a correct type of probe card for a currently running test.

20. The method of claim 19, wherein if, said determining step results in a determination that the probe card currently in use is not the correct type of probe card, the method further comprises the step of indicating that the probe card currently in use is not the correct type.

21. The method of claim 16, wherein said programming step comprises affixing a transponder tag with said magnetic identification to each of said plurality of probe cards.

22. The method of claim 16, wherein said reading step comprises receiving said magnetic identification information and translating said information into an identification code.

* * * * *

UNITED STATES PATENT AND TRADEMARK OFFICE
CERTIFICATE OF CORRECTION

PATENT NO.    : 5,866,024
DATED         : February 2, 1999
INVENTOR(S)   : Thierry de Vileneuve It is certified that error appears in the above-identified patent and that said Letters Patent is hereby corrected as shown below:

On the title page, item [30], should read

[30]    Foreign Application Priority Data
      Dec. 29, 1995 [FR]   France........................95 15862

Signed and Sealed this

Sixth Day of July, 1999

Attest:

Q. TODD DICKINSON

*Attesting Officer*      *Acting Commissioner of Patents and Trademarks*